(12) United States Patent
Fan (10) Patent No.: US 10,498,139 B2
(45) Date of Patent: Dec. 3, 2019

(54) T-COIL DESIGN WITH OPTIMIZED MAGNETIC COUPLING COEFFICIENT FOR IMPROVING BANDWIDTH EXTENSION

(71) Applicant: QUALCOMM Incorporated, San Diego, CA (US)

(72) Inventor: Siqi Fan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 298 days.

(21) Appl. No.: 15/694,628

(22) Filed: Sep. 1, 2017

(65) Prior Publication Data

US 2019/0074687 A1  Mar. 7, 2019

(51) Int. Cl.
| | | |
|---|---|---|
| *H02H 9/04* | (2006.01) | |
| *H01F 27/28* | (2006.01) | |
| *H01L 49/02* | (2006.01) | |
| *H01L 27/02* | (2006.01) | |

(52) U.S. Cl.
CPC ......... *H02H 9/046* (2013.01); *H01F 27/2804* (2013.01); *H01L 27/0288* (2013.01); *H01L 28/10* (2013.01); *H01F 2027/2809* (2013.01)

(58) Field of Classification Search
CPC .............. H02H 9/046; H01F 27/2804; H01F 2027/2809; H01L 27/0288; H01L 28/10
See application file for complete search history.

(56) References Cited

U.S. PATENT DOCUMENTS

| | | | |
|---|---|---|---|
| 7,463,112 B1 * | 12/2008 | Groves | ............... H03H 7/38 333/33 |
| 8,143,987 B2 | 3/2012 | Kireev | |
| 8,395,234 B2 | 3/2013 | Okushima et al. | |

(Continued)

OTHER PUBLICATIONS

Kim S., et al., "Design of a Reliable Broadband I/O Employing T-Coil", Journal of Semiconductor Technology and Science, Dec. 2009, vol. 9, No. 4, pp. 198-204.

*Primary Examiner* — Scott Bauer
(74) *Attorney, Agent, or Firm* — Arent Fox, LLP and Qualcomm, Incorporated (57) ABSTRACT

For a T-coil IC, a first inductor core is on an $M_x$ layer and has n turns (n≥15/8). The first inductor core has a first-inductor-core-first end and a first-inductor-core-second end. A second inductor core is on an $M_{x-2}$ layer and has n turns. The second inductor core has a second-inductor-core-first end and a second-inductor-core-second end. The first-inductor-core-second end is connected to the second-inductor-core-first end by a via stack between the $M_x$ and $M_{x-2}$ layers. A center tap is on an $M_{x-1}$ layer. The center tap is connected to the second inductor core at a node of the second inductor core. A first inductor is formed by the first inductor core between the first-inductor-core-first end and the first-inductor-core-second end and by the second inductor core between the second-inductor-core-first end and the node. A second inductor is formed by the second inductor core between the node and the second-inductor-core-second end.

30 Claims, 5 Drawing Sheets

(56) References Cited

U.S. PATENT DOCUMENTS

| | | |
|---|---|---|
| 9,048,017 B2 | 6/2015 | Kireev |
| 9,502,168 B1 | 11/2016 | Ler et al. |
| 9,508,480 B2 * | 11/2016 | Cho .................. H01F 17/0013 |
| 9,748,938 B2 * | 8/2017 | Kawai ..................... H04L 25/02 |
| 2005/0229126 A1 * | 10/2005 | Wang .................. G06F 17/5081 |
| | | 716/112 |
| 2006/0250198 A1 | 11/2006 | Meltzer et al. |
| 2011/0049672 A1 * | 3/2011 | Okushima ........... H01L 23/5227 |
| | | 257/531 |
| 2011/0133878 A1 * | 6/2011 | Chiu .................. H01F 17/0013 |
| | | 336/200 |
| 2012/0146741 A1 | 6/2012 | Yen et al. |
| 2012/0275074 A1 | 11/2012 | Dill et al. |
| 2016/0078998 A1 | 3/2016 | Park et al. |
| 2016/0099301 A1 * | 4/2016 | Yen ..................... H01L 23/5227 |
| | | 257/531 |
| 2016/0276091 A1 * | 9/2016 | Zhang .................. H01F 27/2804 |
| 2017/0076853 A1 * | 3/2017 | Valentin ............. H01F 27/2804 |
| 2017/0111995 A1 | 4/2017 | Nishikawa et al. |
| 2017/0365389 A1 * | 12/2017 | Yosui .................... H01F 41/071 |
| 2018/0006626 A1 * | 1/2018 | Lyalin ................ H01F 27/2804 |
| 2019/0074129 A1 | 3/2019 | Fan et al. |
| 2019/0074686 A1 | 3/2019 | Fan et al. |

\* cited by examiner

T-COIL DESIGN WITH OPTIMIZED MAGNETIC COUPLING COEFFICIENT FOR IMPROVING BANDWIDTH EXTENSION

BACKGROUND

Field

The present disclosure relates generally to a T-coil design, and more particularly, to a T-coil design with a magnetic coupling coefficient for improving bandwidth extension.

Background

As semiconductor integrated circuit (IC) device dimensions decrease and the operating speed of such ICs increases, devices/transistors on an IC become increasingly vulnerable to electrostatic discharge (ESD). Use of a T-coil circuit (also referred to a T-coil network) may provide ESD protection to such devices/transistors. There is currently a need for improvements in the design of the T-coil circuit.

SUMMARY

In an aspect of the disclosure, a T-coil IC includes a first inductor core on a metal x ($M_x$) layer. The first inductor core has n turns, where n is at least 1⅞ turns. The first inductor core has a first inductor core first end and a first inductor core second end. The T-coil IC further includes a second inductor core on a metal x-2 ($M_{x-2}$) layer. The second inductor core has n turns. The second inductor core has a second inductor core first end and a second inductor core second end. The first inductor core second end is connected to the second inductor core first end by a via stack between the $M_x$ layer and the $M_{x-2}$ layer. The T-coil IC further includes a center tap on a metal x-1 ($W_{x-1}$) layer. The center tap is connected to the second inductor core by a via at a node of the second inductor core. A first inductor is formed by the first inductor core between the first inductor core first end and the first inductor core second end and by the second inductor core between the second inductor core first end and the node. A second inductor is formed by the second inductor core between the node and the second inductor core second end.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As device dimensions decrease and the operating speed of semiconductor ICs increases, devices/transistors on an IC become increasingly vulnerable to ESD. Use of a T-coil circuit may provide ESD protection to such devices/transistors (referred to herein as ESD devices). A T-coil circuit may also improve circuit performance by reducing high frequency signal loss due to ESD capacitance loading. On-chip ESD loading capacitances of high speed input/output (IO) circuits reduce signal bandwidth. A T-coil device may be utilized with inductive peaking from two inductor cores (arms) of both sides of the T-coil to reduce high frequency signal loss due to ESD capacitance loading.

Figure 1:
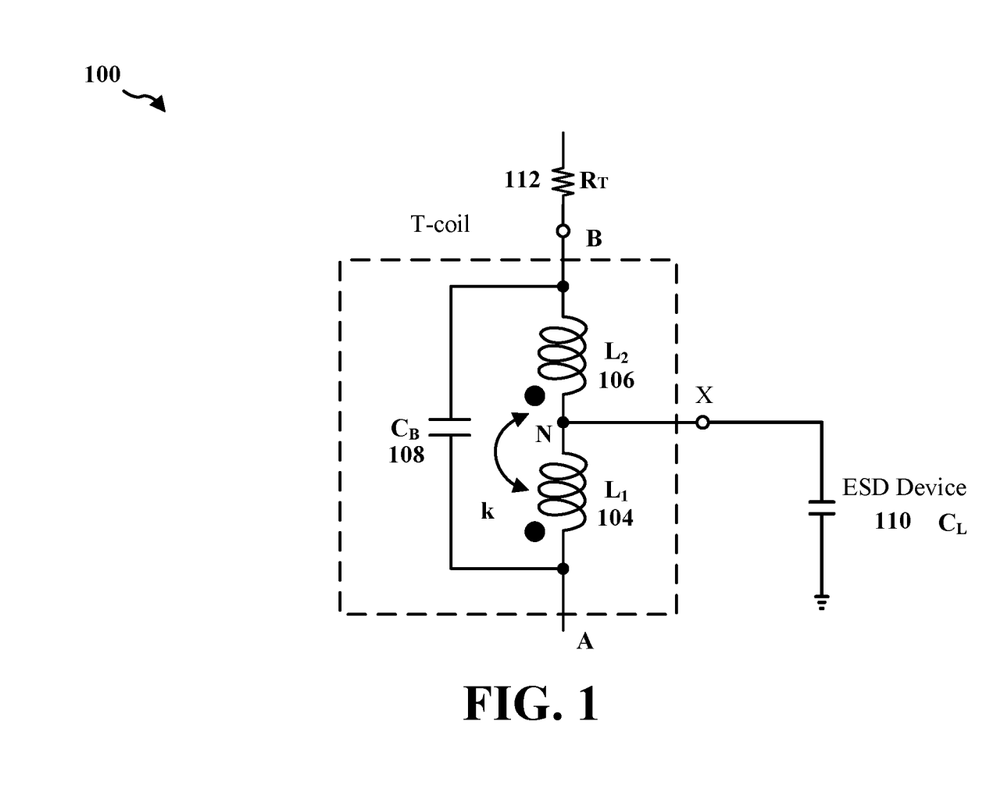
FIG. 1 is a diagram illustrating a T-coil circuit.

FIG. 1 is a diagram illustrating a T-coil circuit 100. As illustrated in FIG. 1, the T-coil circuit 100 includes a first inductor $L_1$ 104 connected between node A and node N and a second inductor $L_2$ 106 connected between node N and node B. The T-coil circuit 100 may further include a bridge capacitance $C_B$ 108. The bridge capacitance $C_B$ 108 may be provided by a bridge capacitor or through an intrinsic/plate-to-plate capacitance of the T-coil circuit 100. The intrinsic/plate-to-plate capacitance of the T-coil circuit 100 may be in overlapping coil portions of the first and second inductors $L_1$, $L_2$. The node N may be connected to an ESD device 110 with a capacitance $C_L$. The node B may be connected to a termination resistor $R_T$ 112. A resistance of the termination resistor $R_T$ is set for impedance matching. The node A may be connected to an input/output pad. The T-coil circuit 100 has a magnetic coupling coefficient k (also referred to as a coupling factor) between the two coils of the first and second inductors $L_1$, $L_2$, where $k=(4\zeta^2-1)/(4\zeta^2+1)$ and $\zeta$ is a damping coefficient of the T-coil transfer function (the T-coil transfer function behaves like a $2^{nd}$ order lower pass filter and is equal to $V_x/I_A$—voltage at X divided by input current at A). The magnetic coupling coefficient k may be controlled through the damping coefficient $\zeta$. A magnetic coupling coefficient k of 0.5 may be best for group delay (output waveform identical to input waveform in the time domain), and a magnetic coupling coefficient k of 0.333 may be best for bandwidth extension. The T-coil may be designed such that the inductance $L=(0.5\ C_L R_T^2)(1+k)$ and the effective bridge capacitance $C_B=(1-K)(C_L/4(1+k))$ to minimize return loss/reflections and to improve the performance/bandwidth/group delay. Setting $C_B$ as indicated minimizes T-coil return loss.

Figure 2:
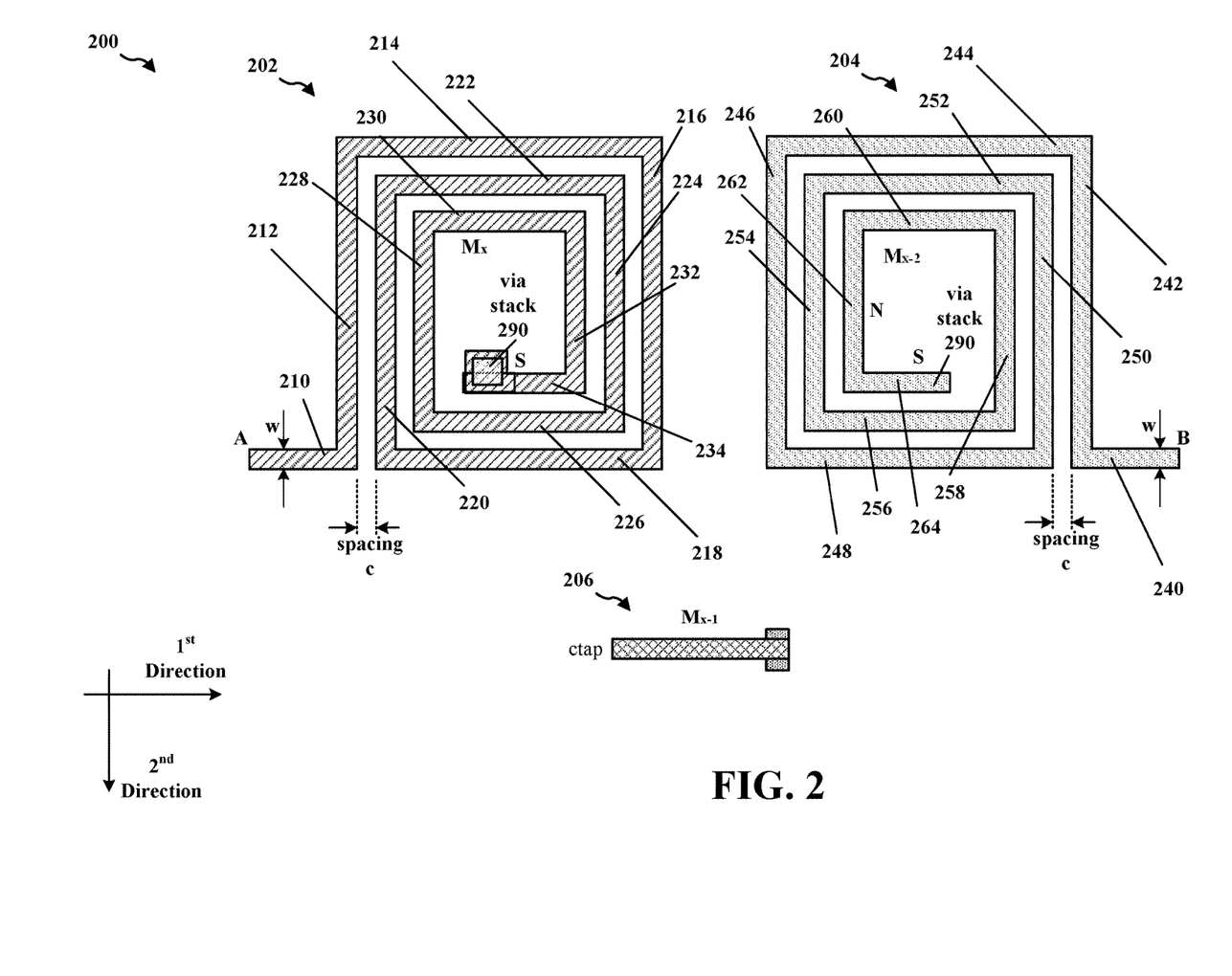
FIG. 2 is a diagram illustrating different layers of an exemplary T-coil IC.

FIG. 2 is a diagram 200 illustrating different layers of an exemplary T-coil IC. The exemplary T-coil IC includes a first inductor core 202 on a metal x ($M_x$) layer, a second inductor core 204 on a metal x-2 ($M_{x-2}$) layer, and a center tap 206 on a metal x-1 ($M_{x-1}$) layer. The first inductor core 202 has a first inductor core first end at A and a first inductor core second end at S. The first inductor core 202 has 2⅞ turns and includes segments 210, 212, 214, 216, 218, 220, 222, 224, 226, 228, 230, 232, 234. As illustrated in FIG. 2, in a first configuration, the segments 212, 214, 216, 218, 220, 222, 224, 226, 228, 230, 232, 234 may have turns (may coil) in a clockwise direction from A to node N. However, in a second configuration, the first inductor core 202 may have turns in a counter-clockwise direction from A to node N. The segment 210 is illustrated extending orthogonal to the segment 212 in the first direction. However, the segment 210 may be co-linear with the segment 212 in the second direction. The second inductor core 204 has a second inductor core first end at S and a second inductor core second end at B. The second inductor core 204 has 2⅞ turns and includes segments 240, 242, 244, 246, 248, 250, 252, 254, 256, 258, 260, 262, 264. As illustrated in FIG. 2, in a first configuration, the segments 242, 244, 246, 248, 250, 252, 254, 256, 258, 260, 262, 264 may have turns (may coil) in a clockwise direction from node N to B. However, in a second configuration, the second inductor core 204 may have turns in a counter-clockwise direction from node N to B. The segment 240 is illustrated extending orthogonal to the segment 242 in the first direction. However, the segment 240 may be co-linear with the segment 242 in the second direction. The first inductor core 202 and the second inductor core 204 are connected at S through a via stack 290 between the $M_x$ layer and the $M_{x-2}$ layer. Such a via stack 290 would include an $M_x$ layer interconnect (first inductor core 202), a via $V_{x-1}$, an $M_{x-2}$ layer interconnect, a via $V_{x-2}$, and an $M_{x-2}$ layer interconnect (second inductor core 204).

The center tap 206 is on an $M_{x-1}$ layer between the $M_x$ and $M_{x-2}$ layers. In one configuration, the first inductor core 202 is on a redistribution layer (RDL) and the second inductor core 204 is two layers below the RDL. The thickness of the first inductor core 202 (e.g., 2.8 μm) on the $M_x$ layer/RDL may be thicker than the second inductor core 204 (e.g., 1.2 μm-1.25 μm) on the $M_{x-2}$ layer. As the first inductor core 202 is thicker than the second inductor core 204, the first inductor core 202 has a lower inductance per unit length than the second inductor core 204. As the first inductor coil 202 has a lower inductance per unit length than the second inductor core 204, in order to achieve $L_1=L_2$ (see FIG. 1), the center tap 206 may be connected to the second inductor core 204 at node N. To determine the location of the node N, the center tap 206 may be slid along the second inductor core 204 between points S and B until simulations show that the inductance between points A and N is approximately equal to the inductance between points N and B. As illustrated in FIG. 2, the node N is along segment 262. However, the node N may be along any of the segments of the second inductor core 204. The center tap 206 is connected to the second inductor core 204 by a via $V_{x-2}$ at the node N of the second inductor core 204. As the center tap 206 is connected to the second inductor core 204 at the node N, a first inductor $L_1$ is formed by the first inductor core 202 between the first inductor core first end at A and the first inductor core second end at S and by the second inductor core 204 between the second inductor core first end at S and the node N, and a second inductor $L_2$ is formed by the second inductor core 204 between the node N and the second inductor core second end at B.

As illustrated in FIG. 2, both the first and second inductor cores 202, 204 have n turns, where n is 2⅞. However, more generally, n may be 1⅞+0.5z, where z is an integer greater than or equal to 0. The line width w for the first and second inductor cores 202, 204 and the spacing c between turns of the first inductor core 202 on the $M_x$ layer and the second inductor core 204 on the $M_{x-2}$ layer may be approximately the same. For example, the line width w of the first and second inductor cores 202, 204 may be 2 μm and the spacing c between neighboring turns for the first and second inductor cores 202, 204 may be 1.8 μm.

Figure 3:
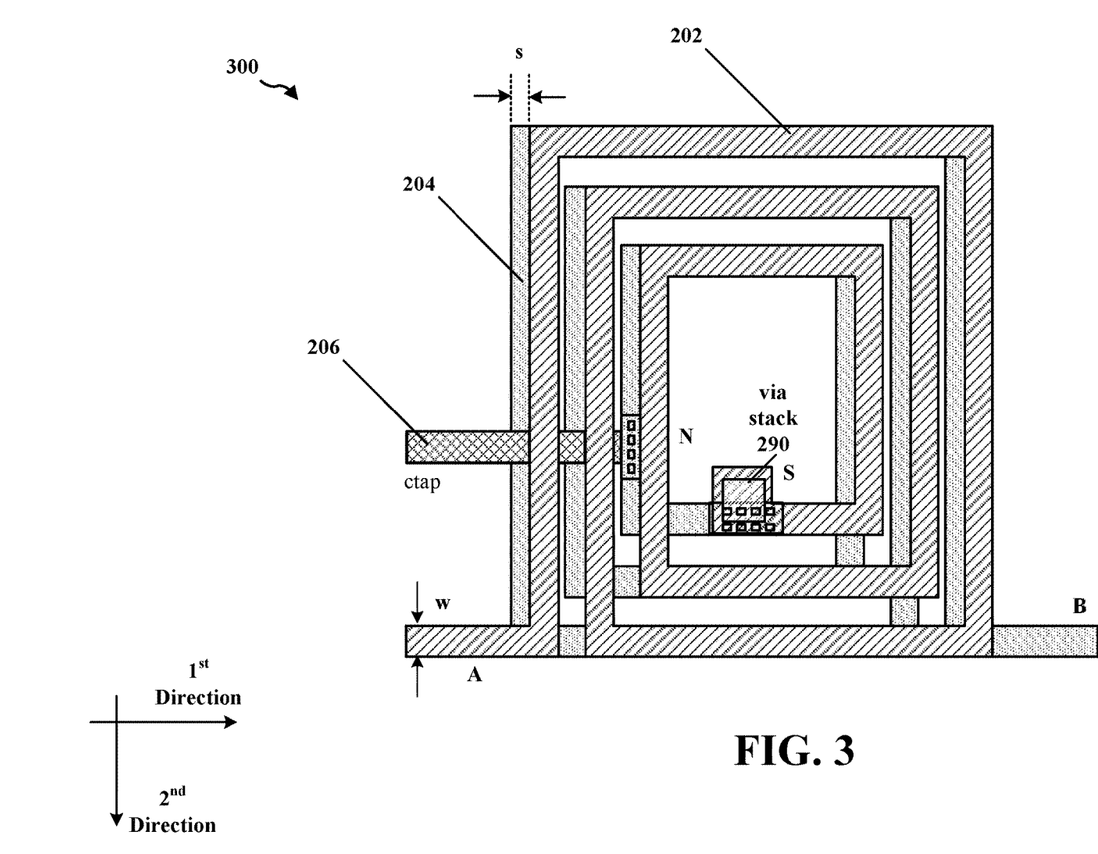
FIG. 3 is a diagram illustrating a plan view of the exemplary T-coil IC.
Figure 4:
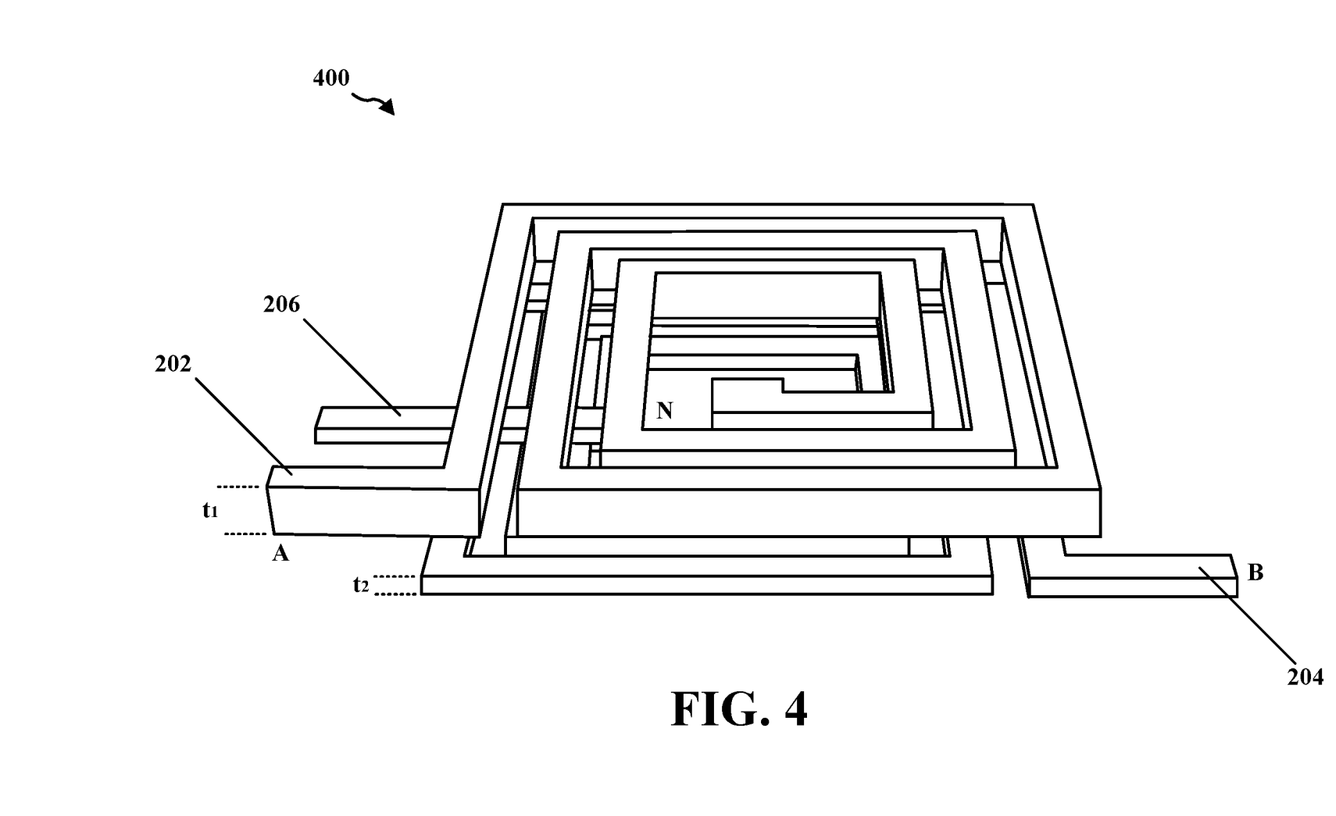
FIG. 4 is a diagram illustrating a 3-dimensional (3D) view of the exemplary T-coil IC.

FIG. 3 is a diagram 300 illustrating a plan view of the exemplary T-coil IC. FIG. 4 is a diagram 400 illustrating a 3D view of the exemplary T-coil IC. As illustrated in FIGS. 3, 4, the first inductor core 202 overlays the second inductor core 204. The first inductor core 202 and the second inductor core 204 are connected together through a via stack 290 at S between the $M_x$ and $M_{x-2}$ layers. The center tap 206 is connected to the second inductor core 204 at the node N. As discussed supra, the thickness $t_1$ of the first inductor core 202 (e.g., 2.8 μm) on the $M_x$ layer/RDL may be greater than a thickness $t_2$ of the second inductor core 204 (e.g., 1.2 μm-1.25 μm) on the $M_{x-2}$ layer.

The gap (spacing between the $M_x$ and $M_{x-2}$ layers) between the first and second inductor cores 202, 204 is approximately 2.6 μm. With the larger gap due to skipping a metal layer (the $M_{x-1}$ layer) between the first and second inductor cores 202, 204, the coupling coefficient k is reduced from about 0.64 to 0.5 or less. The coupling coefficient k is further reduced to approximately 0.4 or less by shifting the first inductor core 202 with respect to the second inductor core 204 by s. As illustrated in FIGS. 3, 4, the first inductor core 202 is shifted in the first direction with respect to the second inductor core 204. In a first configuration, the shift s is approximately 40% to 60% of a line width w of the first and second inductor cores 202, 204. If the line width w is 2 μm, the shift s may be between approximately 0.8 μm and approximately 1.2 μm in the first direction. In a second configuration, the shift s is approximately 50% of a line width w of the first and second inductor cores 202, 204. If the line width w is 2 μm, the shift s may be approximately 1.0 μm in the first direction. The plate-to-plate capacitance $C_B$ of the exemplary T-coil IC may be approximately 5 fF. The plate-to-plate capacitance is due to the overlapping coil portions of the first and second inductors $L_1$, $L_2$. As illustrated in FIGS. 2, 3, 4, the T-coil IC is square shaped. However, the T-coil IC may be rectangular, octagonal, or circular.

Referring again to FIGS. 1-4, a T-coil IC includes a first inductor core 202, a second inductor core 204, and a center tap 206. The first inductor core 202 is on an $M_x$ layer. The first inductor core 202 has n turns, where n is at least 1⅞ turns. The first inductor core 202 has a first inductor core first end at A and a first inductor core second end at S. The second inductor core 204 is on an $M_{x-2}$ layer. The second inductor core 204 has n turns. The second inductor core 204 has a second inductor core first end at S and a second inductor core second end at B. The first inductor core second end at S is connected to the second inductor core first end at S by a via stack 290 at S between the $M_x$ layer and the $M_{x-2}$ layer. The center tap 206 is on an $M_{x-1}$ layer. The center tap 206 is connected to the second inductor core 204 by a via $V_{x-2}$ at a node N of the second inductor core 204. A first inductor $L_1$ is formed by the first inductor core 202 between the first inductor core first end at A and the first inductor core second end at S and by the second inductor core 204 between the second inductor core first end at S and the node N. A second inductor $L_2$ is formed by the second inductor core 204 between the node N and the second inductor core second end at B.

In one configuration, n is 1⅞+0.5z turns, where z is an integer greater than or equal to 0. In another configuration, z is equal 2, and the first inductor and the second inductor each have 2⅞ turns. FIGS. 2, 3, 4 illustrate an example of the T-coil IC with n=2⅞ turns.

In one configuration, the first inductor core 202 overlays the second inductor core 204 with a shift s in a first direction of approximately 40% to 60% of a metal width w of the first inductor core 202 and the second inductor core 204. In one configuration, the shifts in the first direction is approximately 50% of the metal width w of the first inductor core 202 and the second inductor core 204. In one configuration, the first inductor core 202 and the second inductor core 204 each include segments that extend in a first direction and in a second direction orthogonal to the first direction. Segments 214, 244 and 218, 248 at an edge of the first inductor core 202 and the second inductor core 204 that extend in the first direction completely overlay each other (segment 214 completely overlays segment 244, and segment 218 completely overlays segment 248), and segments 212, 246 and 216, 242 at an edge of the first inductor core 202 and the second inductor core 204 that extend in the second direction overlay each other with a shift of approximately 40% to 60% of a metal width w of the first inductor core 202 and the second inductor core 204 (segment 212 with a shift s partially overlays segment 246, and segment 216 with a shifts partially overlays segment 242). In one configuration, the shifts is approximately 50% of the metal width w of the first inductor core 202 and the second inductor core 204.

In one configuration, a metal thickness of the first inductor core 202 is greater than a metal thickness of the second inductor core 204. As discussed supra, the $M_x$ layer, which may be the RDL, may have a metal thickness $t_1$ that is greater than a metal thickness $t_2$ of the $M_{x-2}$ layer. For example, the $M_x$ layer may have a metal thickness $t_1$ of 2.8 μm and the $M_{x-2}$ layer may have a metal thickness $t_2$ of 1.2 μm-1.25 μm. Accordingly, the $M_x$ layer may have a metal thickness $t_1$ that is more than twice the metal thickness $t_2$ of the $M_{x-2}$ layer.

In one configuration, the first inductor core 202 includes a first inductor core first segment 212 extending in a second direction, a first inductor core second segment 214 connected to the first inductor core first segment 212 and extending in a first direction, a first inductor core third segment 216 connected to the first inductor core second segment 214 and extending in the second direction, a first inductor core fourth segment 218 connected to the first inductor core third segment 216 and extending in the first direction, a first inductor core fifth segment 220 connected to the first inductor core fourth segment 218 and extending in the second direction, a first inductor core sixth segment 222 connected to the first inductor core fifth segment 220 and extending in the first direction, a first inductor core seventh segment 224 connected to the first inductor core sixth segment 222 and extending in the second direction, and a first inductor core eighth segment 226 connected to the first inductor core seventh segment 224 and extending in the first direction. In such a configuration, the second inductor core 204 includes a second inductor core first segment 242 extending in the second direction, a second inductor core second segment 244 connected to the second inductor core first segment 242 and extending in the first direction, a second inductor core third segment 246 connected to the second inductor core second segment 244 and extending in the second direction, a second inductor core fourth segment 248 connected to the second inductor core third segment 246 and extending in the first direction, a second inductor core fifth segment 250 connected to the second inductor core fourth segment 248 and extending in the second direction, a second inductor core sixth segment 252 connected to the second inductor core fifth segment 250 and extending in the first direction, a second inductor core seventh segment 254 connected to the second inductor core sixth segment 252 and extending in the second direction, and a second inductor core eighth segment 256 connected to the second inductor core seventh segment 254 and extending in the first direction. The first inductor core first segment 212 primarily overlays the second inductor core third segment 246, the first inductor core second segment 214 primarily overlays the second inductor core second segment 244, the first inductor core third segment 216 primarily overlays the second inductor core first segment 242, the first inductor core fourth segment 218 primarily overlays the second inductor core fourth segment 248, the first inductor core fifth segment 220 primarily overlays the second inductor core seventh segment 254, the first inductor core sixth segment 222 primarily overlays the second inductor core sixth segment 252, and the first inductor core seventh segment 224 primarily overlays the second inductor core fifth segment 250.

In one configuration, the first inductor core first segment 212 primarily overlays the second inductor core third segment 246 with a shift of s % of a metal width w of the first inductor core 202 and the second inductor core 204, the first inductor core second segment 214 primarily overlays the second inductor core second segment 244 without a shift, the first inductor core third segment 216 primarily overlays the second inductor core first segment 242 with the shift of s % of the metal width w of the first inductor core 202 and the second inductor core 204, the first inductor core fourth segment 218 primarily overlays the second inductor core fourth segment 248 without a shift, the first inductor core fifth segment 220 primarily overlays the second inductor core seventh segment 254 with the shift of s % of the metal width w of the first inductor core 202 and the second inductor core 204, the first inductor core sixth segment 222 primarily overlays the second inductor core sixth segment 252 without a shift, and the first inductor core seventh segment 224 primarily overlays the second inductor core fifth segment 250 with the shift of s % of the metal width w of the first inductor core 202 and the second inductor core 204, where 40%≤s≤60%. In one configuration, s is approximately 50% of the metal width w of the first inductor core 202 and the second inductor core 204.

In one configuration, the first inductor core 202 further includes a first inductor core ninth segment 228 connected to the first inductor core eighth segment 226 and extending in the second direction, and a first inductor core tenth segment 230 connected to the first inductor core ninth segment 228 and extending in the first direction. The second inductor core 204 further includes a second inductor core ninth segment 258 connected to the second inductor core eighth segment 256 and extending in the second direction, and a second inductor core tenth segment 260 connected to the second inductor core ninth segment 258 and extending in the first direction. The first inductor core eighth segment 226 primarily overlays the second inductor core eighth segment 256. In one configuration, the first inductor core eighth segment 226 primarily overlays the second inductor core eighth segment 256 without a shift.

In one configuration, the first inductor core 202 further includes a first inductor core eleventh segment 232 connected to the first inductor core tenth segment 230 and extending in the second direction, and a first inductor core twelfth segment 234 connected to the first inductor core eleventh segment 232 and extending in the first direction. The second inductor core 204 further includes a second inductor core eleventh segment 262 connected to the second inductor core tenth segment 260 and extending in the second direction, and a second inductor core twelfth segment 264 connected to the second inductor core eleventh segment 262 and extending in the first direction. The first inductor core ninth segment 228 primarily overlays the second inductor core eleventh segment 262, the first inductor core tenth segment 230 primarily overlays the second inductor core tenth segment 260, and the first inductor core eleventh segment 232 primarily overlays the second inductor core ninth segment 258. In one configuration, the first inductor core ninth segment 228 primarily overlays the second inductor core eleventh segment 262 with the shift of s % of the metal width w of the first inductor core 202 and the second inductor core 204, the first inductor core tenth segment 230 primarily overlays the second inductor core tenth segment 260 without a shift, and the first inductor core eleventh segment 232 primarily overlays the second inductor core ninth segment 258 with the shift of s % of the metal width w of the first inductor core 202 and the second inductor core 204, where 40%≤s≤60%. In one configuration, s is approximately 50% of the metal width w of the first inductor core 202 and the second inductor core 204.

In one configuration, the $M_x$ layer is an RDL. Assuming there are 15 metal layers below the RDL, then in one configuration, the $M_{x-1}$ layer is an $M_{15}$ layer, and the $M_{x-2}$ layer is an $M_{14}$ layer. In one configuration, the T-coil IC is on an IC, and the center tap 206 is connected to an ESD device on the IC. In one configuration, a coupling coefficient k of the T-coil IC is approximately 0.4. As discussed supra, the coupling coefficient k of approximately 0.4 is obtained by skipping one metal layer between the first and second inductor cores 202, 204 and by shifting the first inductor core 202 with respect to the second inductor core 204. The first and second inductor cores 202, 204 may be on the $M_x$ layer/RDL and the $M_{x-2}$ layer, respectively.

Figure 5:
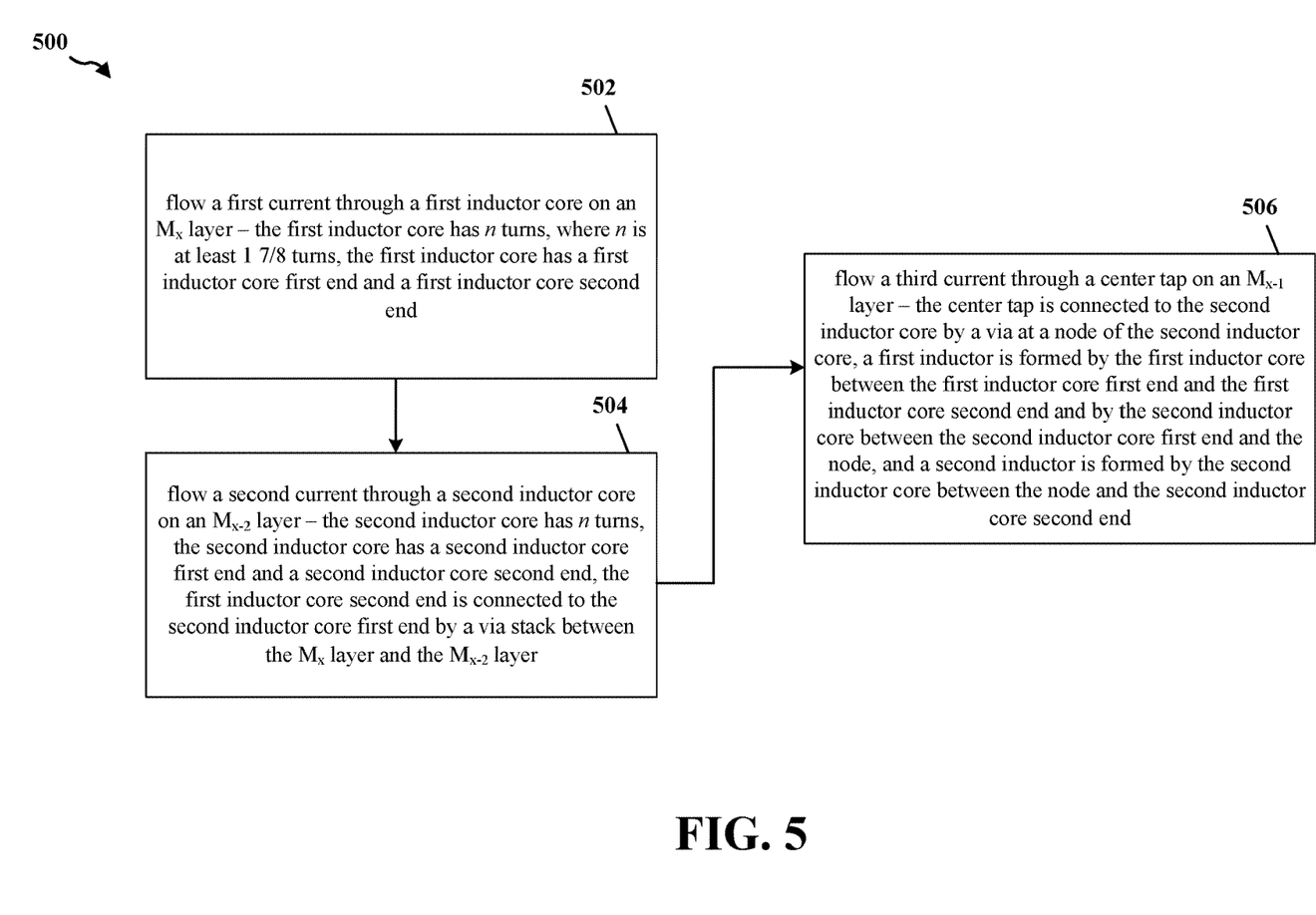
FIG. 5 is a diagram illustrating a method of operation of the exemplary T-coil IC.

FIG. 5 is a diagram 500 illustrating a method of operation of the exemplary T-coil IC. At 502, a first current flows through a first inductor core 202 on an $M_x$ layer. The first inductor core 202 has n turns, where n is at least 1⅞ turns. The first inductor core 202 has a first inductor core first end at A and a first inductor core second end at S. At 504, a second current flows through a second inductor core 204 on an $M_{x-2}$ layer. The second inductor core 204 has n turns. The second inductor core 204 has a second inductor core first end at S and a second inductor core second end at B. The first inductor core second end at S is connected to the second inductor core first end at S by a via stack 290 at S between the $M_x$ layer and the $M_{x-2}$ layer. At 506, a third current flows through a center tap 206 on an $M_{x-1}$ layer. The center tap 506 is connected to the second inductor core 204 by a via $V_{x-2}$ at a node N of the second inductor core 204. A first inductor $L_1$ is formed by the first inductor core 202 between the first inductor core first end at A and the first inductor core second end at S and by the second inductor core 204 between the second inductor core first end at S and the node N, and a second inductor $L_2$ is formed by the second inductor core 204 between the node N and the second inductor core second end at B.

In one configuration, a T-coil IC includes means for flowing a first current through a first inductor core 202 on an $M_x$ layer. The first inductor core 202 has n turns, where n is at least 1⅞ turns. The first inductor core 202 has a first inductor core first end at A and a first inductor core second end at S. The T-coil IC further includes means for flowing a second current through a second inductor core 204 on an $M_{x-2}$ layer. The second inductor core 204 has n turns. The second inductor core 204 has a second inductor core first end at S and a second inductor core second end at B. The first inductor core second end at S is connected to the second inductor core first end at S by a via stack 290 at S between the $M_x$ layer and the $M_{x-2}$ layer. The T-coil IC further includes means for flowing a third current through a center tap 206 on an $M_{x-1}$ layer. The center tap 206 is connected to the second inductor core 204 by a via $V_{x-2}$ at a node N of the second inductor core 204. A first inductor $L_1$ is formed by the first inductor core 202 between the first inductor core first end at A and the first inductor core second end at S and by the second inductor core 204 between the second induc-tor core first end at S and the node N, and a second inductor $L_2$ is formed by the second inductor core 204 between the node N and the second inductor core second end at B.

Referring again to FIGS. 1-5, the exemplary T-coil IC provides a coupling coefficient k that is approximately 0.4, which is good for both bandwidth extension and group delay. The coupling coefficient k is reduced through increasing a gap between the first and second inductor cores 202, 204 by locating the first and second inductor cores 202, 204 on the $M_x$ and $M_{x-2}$ layers, respectively, and through shifting the first inductor core 202 with respect to the second inductor core 204 in a first direction. A center tap 206 may be located on the $M_{x-1}$ layer, between the $M_x$ and $M_{x-2}$ layers. As the first inductor core 202 has a greater thickness and, consequently, a lower inductance per unit length than the second inductor core 204, the center tap 206 may be connected to the second inductor core 204. The center tap 206 may be located along the second inductor core 204 in order to balance an inductance of the first and second inductors $L_1$, $L_2$.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A T-coil integrated circuit (IC), comprising:
  a first inductor core on a metal x ($M_x$) layer, the first inductor core having n turns, where n is at least 1⅞ turns, the first inductor core having a first inductor core first end and a first inductor core second end;

a second inductor core on a metal x-2 ($M_{x-2}$) layer, the second inductor core having n turns, the second inductor core having a second inductor core first end and a second inductor core second end, the first inductor core second end being connected to the second inductor core first end by a via stack between the $M_x$ layer and the $M_{x-2}$ layer; and a center tap on a metal x-1 ($M_{x-1}$) layer, the center tap being connected to the second inductor core by a via at a node of the second inductor core, wherein a first inductor is formed by the first inductor core between the first inductor core first end and the first inductor core second end and by the second inductor core between the second inductor core first end and the node, and a second inductor is formed by the second inductor core between the node and the second inductor core second end.

2. The T-coil IC of claim 1, wherein n is 1⅞+0.5z turns, where z is an integer greater than or equal to 0.

3. The T-coil IC of claim 2, wherein z is equal 2, and the first inductor and the second inductor each have 2⅞ turns.

4. The T-coil IC of claim 1, wherein the first inductor core overlays the second inductor core with a shift in a first direction of approximately 40% to 60% of a metal width of the first inductor core and the second inductor core.

5. The T-coil IC of claim 4, wherein the shift in the first direction is approximately 50% of the metal width of the first inductor core and the second inductor core.

6. The T-coil IC of claim 1, wherein the first inductor core and the second inductor core each comprises segments that extend in a first direction and in a second direction orthogonal to the first direction, and wherein segments at an edge of the first inductor core and the second inductor core that extend in the first direction completely overlay each other, and segments at an edge of the first inductor core and the second inductor core that extend in the second direction overlay each other with a shift of approximately 40% to 60% of a metal width of the first inductor core and the second inductor core.

7. The T-coil IC of claim 6, wherein the shift is approximately 50% of the metal width of the first inductor core and the second inductor core.

8. The T-coil IC of claim 1, wherein a metal thickness of the first inductor core is greater than a metal thickness of the second inductor core.

9. The T-coil IC of claim 1, wherein:

the first inductor core comprises a first inductor core first segment extending in a second direction, a first inductor core second segment connected to the first inductor core first segment and extending in a first direction, a first inductor core third segment connected to the first inductor core second segment and extending in the second direction, a first inductor core fourth segment connected to the first inductor core third segment and extending in the first direction, a first inductor core fifth segment connected to the first inductor core fourth segment and extending in the second direction, a first inductor core sixth segment connected to the first inductor core fifth segment and extending in the first direction, a first inductor core seventh segment connected to the first inductor core sixth segment and extending in the second direction, and a first inductor core eighth segment connected to the first inductor core seventh segment and extending in the first direction;

the second inductor core comprises a second inductor core first segment extending in the second direction, a second inductor core second segment connected to the second inductor core first segment and extending in the first direction, a second inductor core third segment connected to the second inductor core second segment and extending in the second direction, a second inductor core fourth segment connected to the second inductor core third segment and extending in the first direction, a second inductor core fifth segment connected to the second inductor core fourth segment and extending in the second direction, a second inductor core sixth segment connected to the second inductor core fifth segment and extending in the first direction, a second inductor core seventh segment connected to the second inductor core sixth segment and extending in the second direction, and a second inductor core eighth segment connected to the second inductor core seventh segment and extending in the first direction; and the first inductor core first segment primarily overlays the second inductor core third segment, the first inductor core second segment primarily overlays the second inductor core second segment, the first inductor core third segment primarily overlays the second inductor core first segment, the first inductor core fourth segment primarily overlays the second inductor core fourth segment, the first inductor core fifth segment primarily overlays the second inductor core seventh segment, the first inductor core sixth segment primarily overlays the second inductor core sixth segment, and the first inductor core seventh segment primarily overlays the second inductor core fifth segment.

10. The T-coil IC of claim 9, wherein the first inductor core first segment primarily overlays the second inductor core third segment with a shift of s % of a metal width of the first inductor core and the second inductor core, the first inductor core second segment primarily overlays the second inductor core second segment without a shift, the first inductor core third segment primarily overlays the second inductor core first segment with the shift of s % of the metal width of the first inductor core and the second inductor core, the first inductor core fourth segment primarily overlays the second inductor core fourth segment without a shift, the first inductor core fifth segment primarily overlays the second inductor core seventh segment with the shift of s % of the metal width of the first inductor core and the second inductor core, the first inductor core sixth segment primarily overlays the second inductor core sixth segment without a shift, and the first inductor core seventh segment primarily overlays the second inductor core fifth segment with the shift of s % of the metal width of the first inductor core and the second inductor core, where $40\% \leq s \leq 60\%$.

11. The T-coil IC of claim 10, wherein s is approximately 50% of the metal width of the first inductor core and the second inductor core.

12. The T-coil IC of claim 9, wherein:

the first inductor core further comprises a first inductor core ninth segment connected to the first inductor core eighth segment and extending in the second direction, and a first inductor core tenth segment connected to the first inductor core ninth segment and extending in the first direction;

the second inductor core further comprises a second inductor core ninth segment connected to the second inductor core eighth segment and extending in the second direction, and a second inductor core tenth segment connected to the second inductor core ninth segment and extending in the first direction; and the first inductor core eighth segment primarily overlays the second inductor core eighth segment.

13. The T-coil IC of claim 12, wherein the first inductor core eighth segment primarily overlays the second inductor core eighth segment without a shift.

14. The T-coil IC of claim 12, wherein:

the first inductor core further comprises a first inductor core eleventh segment connected to the first inductor core tenth segment and extending in the second direction, and a first inductor core twelfth segment connected to the first inductor core eleventh segment and extending in the first direction;

the second inductor core further comprises a second inductor core eleventh segment connected to the second inductor core tenth segment and extending in the second direction, and a second inductor core twelfth segment connected to the second inductor core eleventh segment and extending in the first direction; and the first inductor core ninth segment primarily overlays the second inductor core eleventh segment, the first inductor core tenth segment primarily overlays the second inductor core tenth segment, and the first inductor core eleventh segment primarily overlays the second inductor core ninth segment.

15. The T-coil IC of claim 14, wherein the first inductor core ninth segment primarily overlays the second inductor core eleventh segment with the shift of s % of the metal width of the first inductor core and the second inductor core, the first inductor core tenth segment primarily overlays the second inductor core tenth segment without a shift, and the first inductor core eleventh segment primarily overlays the second inductor core ninth segment with the shift of s % of the metal width of the first inductor core and the second inductor core, where 40%≤s≤60%.

16. The T-coil IC of claim 1, wherein the $M_x$ layer is a redistribution layer (RDL).

17. The T-coil IC of claim 16, wherein the $M_{x-1}$ layer is an $M_{15}$ layer, and the $M_{x-2}$ layer is an $M_{14}$ layer.

18. The T-coil IC of claim 1, wherein the T-coil IC is on an IC, and the center tap is connected to an electrostatic discharge (ESD) device on the IC.

19. The T-coil IC of claim 1, wherein a coupling coefficient k of the T-coil IC is approximately 0.4.

20. A method of operation of a T-coil integrated circuit (IC), comprising:

flowing a first current through a first inductor core on a metal x ($M_x$) layer, the first inductor core having n turns, where n is at least 1⅞ turns, the first inductor core having a first inductor core first end and a first inductor core second end;

flowing a second current through a second inductor core on a metal x-2 ($M_{x-2}$) layer, the second inductor core having n turns, the second inductor core having a second inductor core first end and a second inductor core second end, the first inductor core second end being connected to the second inductor core first end by a via stack between the $M_x$ layer and the $M_{x-2}$ layer; and flowing a third current through a center tap on a metal x-1 ($M_{x-1}$) layer, the center tap being connected to the second inductor core by a via at a node of the second inductor core, wherein a first inductor is formed by the first inductor core between the first inductor core first end and the first inductor core second end and by the second inductor core between the second inductor core first end and the node, and a second inductor is formed by the second inductor core between the node and the second inductor core second end.

21. The method of operation of the T-coil IC of claim 20, wherein n is 1⅞+0.5z turns, where z is an integer greater than or equal to 0.

22. The method of operation of the T-coil IC of claim 20, wherein the first inductor core overlays the second inductor core with a shift in a first direction of approximately 40% to 60% of a metal width of the first inductor core and the second inductor core.

23. The method of operation of the T-coil IC of claim 20, wherein a metal thickness of the first inductor core is greater than a metal thickness of the second inductor core.

24. The method of operation of the T-coil IC of claim 20, wherein the $M_x$ layer is a redistribution layer (RDL).

25. The method of operation of the T-coil IC of claim 20, wherein a coupling coefficient k of the T-coil IC is approximately 0.4.

26. A T-coil integrated circuit (IC), comprising:

means for flowing a first current through a first inductor core on a metal x ($M_x$) layer, the first inductor core having n turns, where n is at least 1⅞ turns, the first inductor core having a first inductor core first end and a first inductor core second end;

means for flowing a second current through a second inductor core on a metal x-2 ($M_{x-2}$) layer, the second inductor core having n turns, the second inductor core having a second inductor core first end and a second inductor core second end, the first inductor core second end being connected to the second inductor core first end by a via stack between the $M_x$ layer and the $M_{x-2}$ layer; and means for flowing a third current through a center tap on a metal x-1 ($M_{x-1}$) layer, the center tap being connected to the second inductor core by a via at a node of the second inductor core, wherein a first inductor is formed by the first inductor core between the first inductor core first end and the first inductor core second end and by the second inductor core between the second inductor core first end and the node, and a second inductor is formed by the second inductor core between the node and the second inductor core second end.

27. The T-coil IC of claim 26, wherein n is 1⅞+0.5z turns, where z is an integer greater than or equal to 0.

28. The T-coil IC of claim 26, wherein the first inductor core overlays the second inductor core with a shift in a first direction of approximately 40% to 60% of a metal width of the first inductor core and the second inductor core.

29. The T-coil IC of claim 26, wherein a metal thickness of the first inductor core is greater than a metal thickness of the second inductor core.

30. The T-coil IC of claim 26, wherein the $M_x$ layer is a redistribution layer (RDL).

* * * * *